United States Patent [19]
Choi et al.

[11] Patent Number: 5,299,161
[45] Date of Patent: Mar. 29, 1994

[54] METHOD AND DEVICE FOR IMPROVING PERFORMANCE OF A PARALLEL WRITE TEST OF A SEMICONDUCTOR MEMORY DEVICE

[75] Inventors: Hoon Choi, Teagu; Dong-Il Shu, Seoul, both of Rep. of Korea

[73] Assignee: Samsung Electronics Co., Ltd., Suwon, Rep. of Korea

[21] Appl. No.: 794,631

[22] Filed: Nov. 18, 1991

Related U.S. Application Data

[63] Continuation of Ser. No. 486,405, Feb. 28, 1990, abandoned.

[30] Foreign Application Priority Data

Dec. 29, 1989 [KR] Rep. of Korea ............... 20103/1989

[51] Int. Cl.⁵ .................. G11C 7/00; G11C 29/00; G06F 11/00
[52] U.S. Cl. ...................... 365/201; 365/201; 365/220; 365/238.5; 371/10.1; 371/10.2; 371/21.1
[58] Field of Search ............ 365/200, 201, 220, 238.5; 371/10.1–10.3, 21.1–21.3

[56] References Cited

U.S. PATENT DOCUMENTS

| | | | |
|---|---|---|---|
| 4,599,709 | 7/1986 | Clemons | 365/200 |
| 4,670,878 | 6/1987 | Childers | 365/201 |
| 4,727,516 | 2/1988 | Yoshida et al. | 365/200 |
| 4,752,929 | 6/1988 | Kantz et al. | 365/201 X |
| 4,829,480 | 5/1989 | Seo | 365/200 |
| 4,855,621 | 8/1989 | Hoffman et al. | 371/10.1 X |
| 4,888,772 | 12/1989 | Tanigawa | 371/21.2 |
| 4,906,994 | 3/1990 | Hoffman et al. | 365/201 |
| 4,956,819 | 9/1990 | Hoffmann et al. | 365/201 |
| 5,075,892 | 12/1991 | Choy | 371/68.1 X |
| 5,140,553 | 8/1992 | Choi et al. | 365/201 |

*Primary Examiner*—Joseph L. Dixon
*Assistant Examiner*—Michael A. Whitfield
*Attorney, Agent, or Firm*—Bushnell, Robert E.

[57] ABSTRACT

A semiconductor memory device having normal columns and redundant columns includes normal column decoders for designating the normal columns and redundant column decoders for designating the redundant columns so that the bits from the normal columns are combined with the bits from the redundant columns so as to provide an entire byte. The normal column decoders are to be operated simultaneously with the redundant column decoders.

10 Claims, 3 Drawing Sheets

METHOD AND DEVICE FOR IMPROVING PERFORMANCE OF A PARALLEL WRITE TEST OF A SEMICONDUCTOR MEMORY DEVICE

This is a continuation of application Ser. No. 07/486,405 filed on 28 Feb. 1990, now abandoned.

BACKGROUND OF THE INVENTION

The present invention generally relates to a memory test performance in a semiconductor memory device and, more particularly, to a semiconductor memory device for use in a multiple bit parallel test, reducing memory test time.

In recent years, as a semiconductor memory device or memory array is highly advanced in its density and in its accuracy, a test processing time for checking the memory device is increased accordingly, so greatly that operating current is very largely wasted and the redundancy efficiency is lowered. Since the lowered redundant efficiency requires more redundant memory arrays per chip, the cost for manufacturing the semiconductor memory chip is increased. Therefore, in order to reduce the test processing time prolonged, a parallel test technique is generally used in a semiconductor memory device, i.e., for example, a 4-bit group is used to perform the parallel test in a 1 Mega byte memory device; an 8-bit group is used in a 4 Mega byte memory device ; and a 16- or more than 16-bit group is used in a 16 Mega byte memory device.

Generally, it is necessary for a semiconductor memory device to be able to access multiple bits in order to perform the multiple bit parallel test. A known method is to increase the transistors coupled between the bit lines and the I/O lines in number. In this case, the transistors are controlled by only a single column address decoder, the respective gates of the transistors being coupled to output of the column address decoder, more strictly, to column selection lines thereof. That is to say, it is an approach to improve the parallel test performances by increasing the number of the columns which are selected at one time.

FIG. 1 shows schematically a conventional semiconductor memory device for performing the multiple bit parallel test. As illustrated in the drawing, bit lines $BL_1/\overline{BL}_1-BL_4/\overline{BL}_4$ coupled to respective sense amplifiers $SA_1-SA_4$ each of which share a plurality of memory cells M with a row decoder 10 in the manner as shown in FIG. 1. Then, the bit lines $BL_1/\overline{BL}_1-BL_4/\overline{BL}_4$ are coupled to each corresponding source of a plurality of gating transistors 20 of which drains are coupled to the I/O lines $I/O_1/\overline{I/O}_1-I/O_4/\overline{I/O}_4$ and of which gates are commonly coupled to the output of the column decoder 30. The column address decoder 30, receiving column address signals $XC_{AA}$, $XC_{AB}$ provided from a column address buffer (not shown) and receiving a parallel test signal FTE, generates its output to the gates of the gating transistors 20.

However, when a great number of the bit lines are coupled to the output of one column decoder 30 as illustrated in FIG. 1 and, accordingly, the number of columns selected at one time is increased, there arise undesirable problems which are described hereinbelow.

First of all, when implementing a column redundancy operation, which is a technique of replacing a normal column having a defective memory cell by a redundant column in a semiconductor memory device, the output of the single column decoder 30 is the same as that of the columns required for the redundant column. Therefore, when the number of the bits which are accessed at one time during a parallel test mode is increased, the required number of the redundant columns per chip is undesirably enlarged. For this reason, the number of the redundant columns, which is based on the probability of replacing the defective memory cells, is decreased and, at the same time, the efficiency of the memory device is curtailed.

Secondly, if a plurality of the bit lines (or columns) are coupled to the output of the single column decoder 30 so as to access the bit lines $BL_1/\overline{BL}_1-BL_4/\overline{BL}_4$ in the conventional manner of FIG. 1, the I/O lines are coupled at the same time to the bit lines and, therefore, the current is conducted from the I/O lines, which are pre-charged or pulled-up to the bit lines. The current is increased in proportion with to the increased number of the columns. When operated in a normal mode so as to perform the parallel test, the semiconductor memory device consumes a great power relatively. Therefore, the current conducted from the pre-charged I/O lines to the bit lines is reduced, causing a low operating current.

SUMMARY OF THE INVENTION

It is therefore an object of the present invention to provide an apparatus and a method capable of reducing current consumption during a parallel test, by driving a semiconductor memory device separately between in a normal mode and in a test mode.

It is an another object of the present invention to provide an apparatus for elevating redundant efficiency of a semiconductor memory device having redundant columns by reducing the number of the columns required for the parallel test performance.

According to an aspect of the present invention, the advanced semiconductor memory device for implementing the parallel test with a plurality of bit lines has a number of columns which are selected when processing the plurality of bits in parallel, the number of columns being at least one greater than that of the columns which are selected during a normal mode.

According to another aspect of the present invention, the semiconductor memory device having normal columns and redundant columns, for implementing multiple bit parallel test, includes a plurality of normal column decoders for selecting the normal columns and a redundant column decoder for selecting the redundant columns.

These and other objects, features and advantages of the present invention will now become apparent from the following detailed description of the preferred embodiment taken in conjunction with the accompanying drawings, throughout which like reference numerals and symbols designate like elements and parts.

BRIEF DESCRIPTION OF THE DRAWINGS

For a better understanding of the invention and to show how the same may be carried into effect, reference will now be made, by way of example, to the accompanying diagrammatic drawings, in which.

DETAILED DESCRIPTION OF THE PREFERRED EMBODIMENTS

A preferred embodiment of the semiconductor memory device according to the present invention is first described with reference to FIG. 2, hereinbelow.

Figure 1:
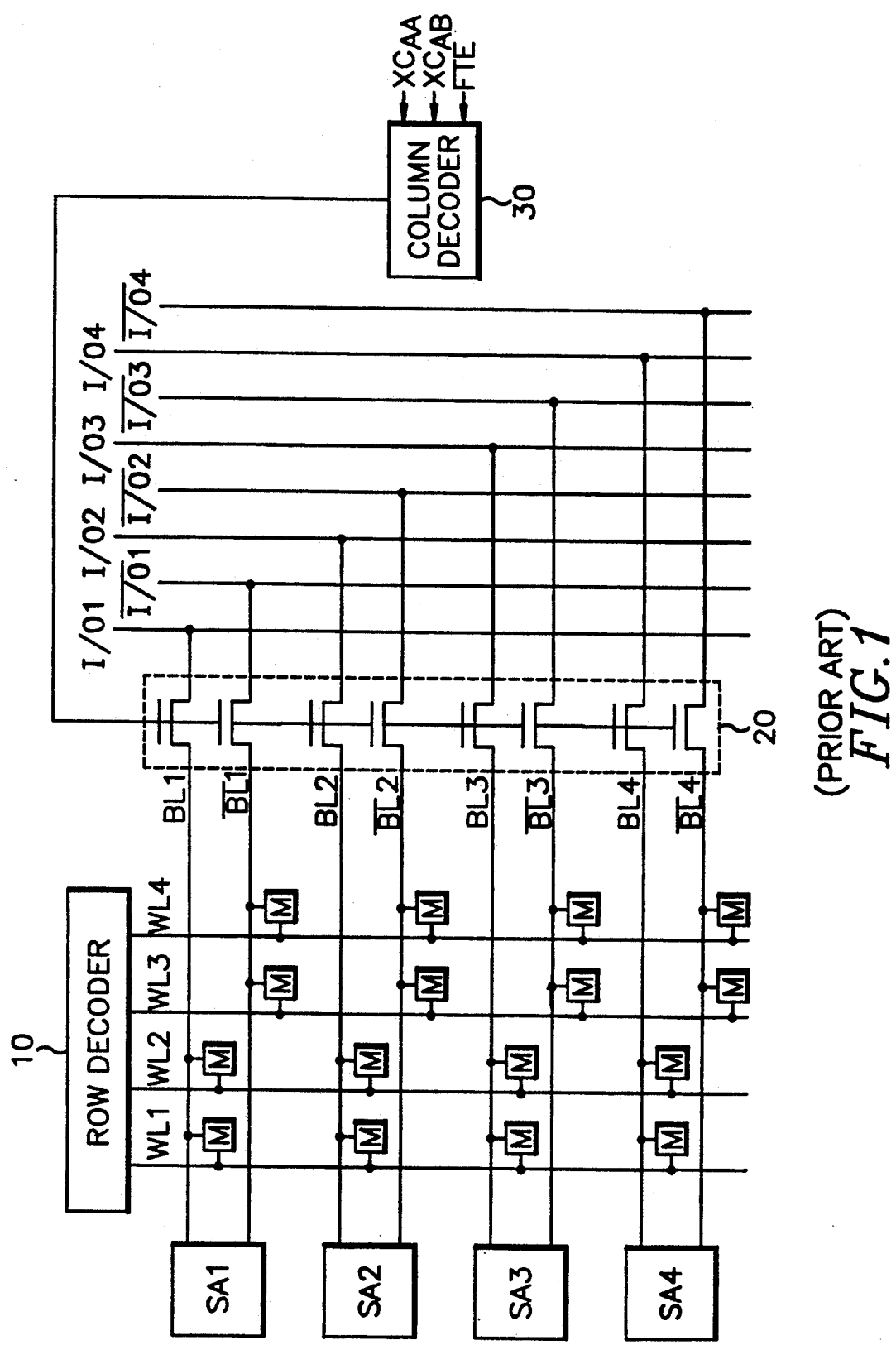
FIG. 1 is a prior art semiconductor memory device for implementing paralell test.
Figure 2:
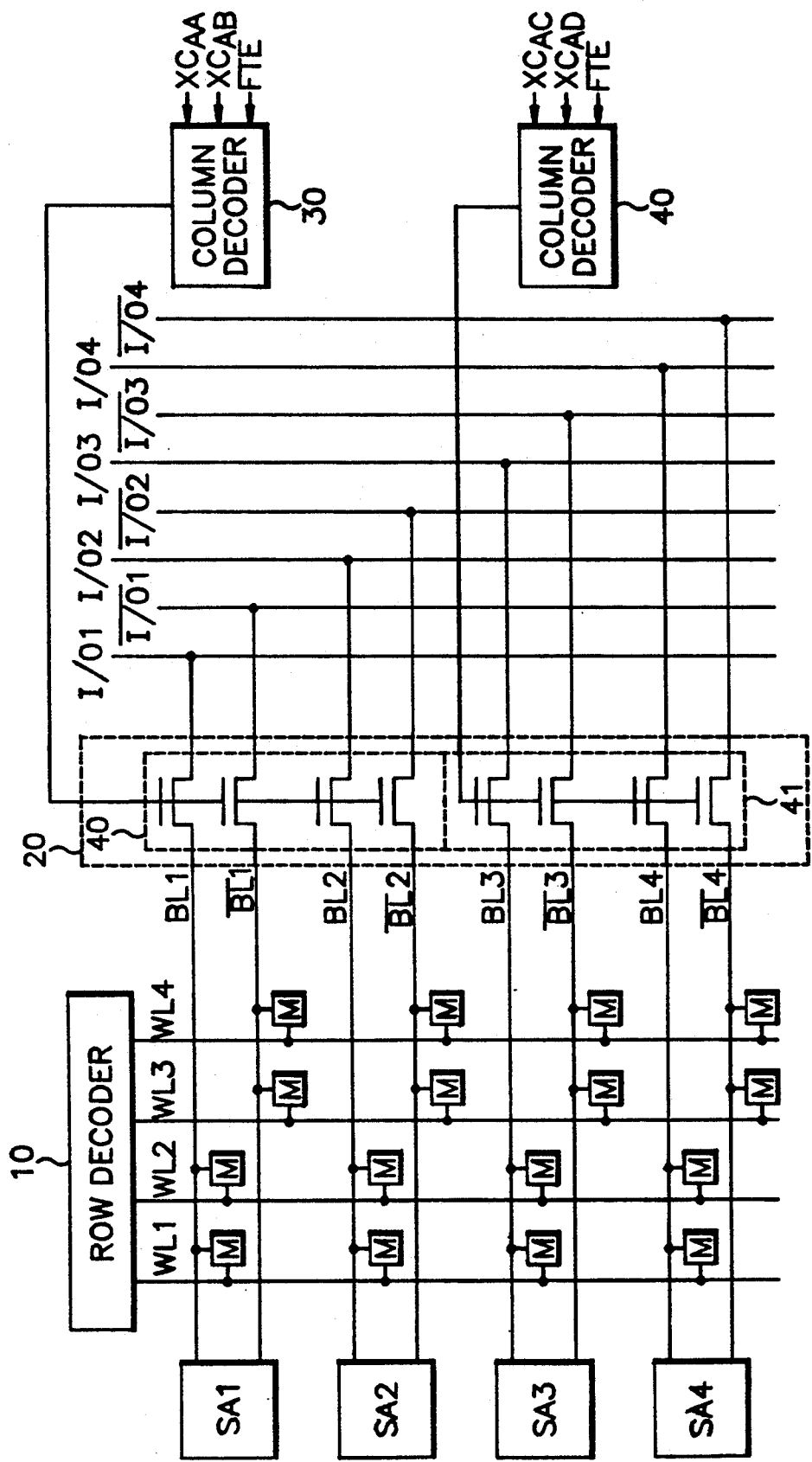
FIG. 2 is a preferred embodiment of the present invention.

Being different from the prior art semiconductor memory device of FIG. 1, the embodiment of the invention, as best illustrated in FIG. 2, has a separate a gating transistor group 40 for electrically coupling the bit lines $BL_1/\overline{BL}_1-BL_2/\overline{BL}_2$ to the I/O lines $I/O_1/\overline{I/O}_2-/I/O_2$.$/\overline{I/O}_2$, and another gating transistor group 41 for electrically coupling the bit lines $BL_3/\overline{BL}_3-BL_4/\overline{BL}_4$ to the I/O lines $I/O_2/\overline{I/O}_3-I/O_4/\overline{I/O}_4$.

Thus, when operated in the normal mode, any one of the word lines $WL_1-WL_4$ is designated by the row address decoder 10. For example, assuming a first word line $WL_1$ is designated, data of the memory cells M coupled to the first word line is transferred to the first bit line $BL_1/\overline{BL}_1$ and there the charge is shared (divided) with the I/O lines $I/O_1/\overline{I/O}_1$ in a given manner. At about the same moment, a first sense amplifier $SA_1$ is enabled to have the bit line $BL_1$ at a power supply voltage level or ground level while having the bit line $\overline{BL}_1$ at the ground level or power supply level which is complementary to the signal of the bit line $BL_1$.

The I/O lines $I/O_1/\overline{I/O}_1-I/O_4/\overline{I/O}_4$ make the charge sharing by way of the gating transistor group 40 or another gating transistor group 41 of which gates are respectively coupled to the output of the column decoders 30, 40, when one of either output of the column address decoders 30, 40 goes to the logic "high" state according to the logic states of the column address signals $XC_{AA}$, $XC_{AB}$, and $XC_{AD}$. In this way, the data of the memory cells M is transferred to the I/O lines $I/O_1$-$/\overline{I/O}_1-I/O_4/\overline{I/O}_4$.

The I/O lines are pre-charged or equalized before the output of the selected column decoder goes to the logic "high". It is therefore understood that the amount of the current being conducted from the I/O lines to the bit lines utterly depends upon the number of columns coupled to the I/O lines.

On the other hand, when operated in the parallel test mode, the two different column decoders 30, 40 designate the entire four columns, i.e., the entire bit lines $BL_1/\overline{BL}_1-BL_4/\overline{BL}_4$, because either of the column address signals $XC_{AA}$ or $XC_{AB}$, and either of the column address signals $XC_{AC}$ or $XC_{AD}$ are disabled by the parallel test enable signal FTE. Therefore, it will be well understood by those in the art that the current consumption arisen during the normal mode may be remarkably lowered (to substantially half that of the prior semiconductor device), because the embodiment of the invention is operated separately when it is in the normal mode from when it is in the parallel test mode.

Figure 3:
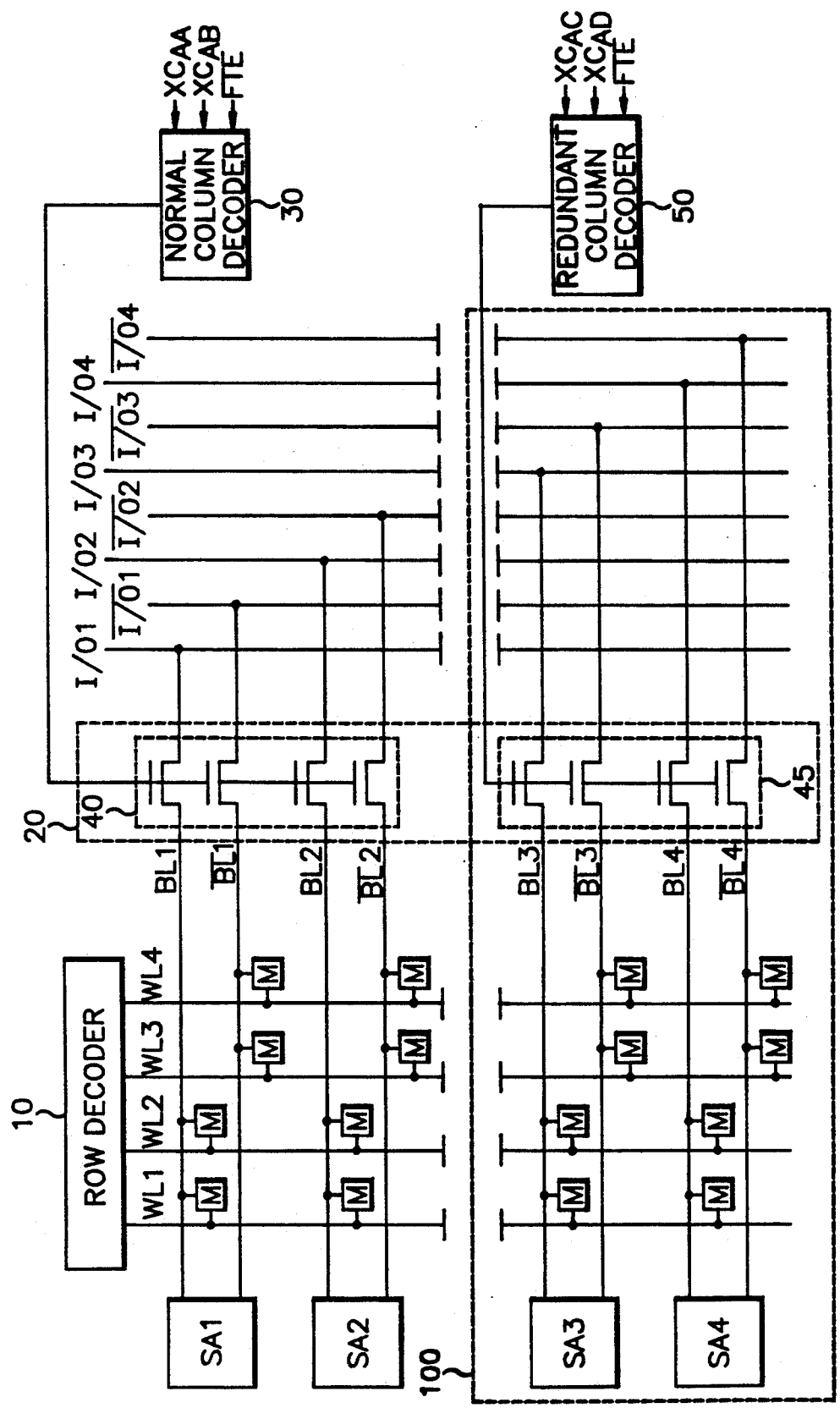
FIG. 3 is another preferred embodiment of the present invention.

Referring now to FIG. 3, another embodiment of the invention is shown which has a plurality of redundant columns therein. As best illustrated in the drawing, a spare cell array 100 and a redundant column decoder 50 are to the semiconductor memory device illustrated FIG. 2. Herein, the gate of the gating transistor group 45 in the spare cell array 100 is coupled to the output of the redundant column decoder 50 and the normal cell array illustrated at the upper part of the spare cell array 100 is substantially the same with that of FIG. 2.

In general, the so-called redundant technique means that when a defective normal column is detected, it is replaced by a redundant column by turning off a normal column decoder and, at the same time, turning on a redundant column decoder. In this manner, a desired bit may be accessed. Since the number of redundant columns per given area becomes great when the normal column is organized as shown in FIG. 1, a separate redundant column decoder 50 which corresponds to the redundant column is prepared as illustrated in FIG. 3.

Therefore, the greater number of the redundancy may be implemented with the same number of columns. Namely, when the semiconductor memory device of FIG. 3 is in the parallel test mode, if a defective column address is detected, an accessed will be a combination of bits from the normal columns and byte from the redundant columns.

As described above, the invention has an advantage in that the power consumption caused by the current being conducted from the I/O lines, which are pre-charged during the normal mode and then continuously pulled-up, to the bit lines is reduced, by designating the columns with at least two column decoders. The invention has another advantage of achieving a high redundant efficiency in a semiconductor memory device by reducing the number of columns coupled to the output of a column decoder.

Although the above invention has been described in its preferred embodiments, it will be obvious that various modifications can be made without deporting from the invention. For example, although the embodiments are described as a semiconductor memory device having four word lines and four bit lines, the principle can be utilized in a memory device having more than four word lines and bit lines.

Since certain changes may be made in the above apparatus and process without departing from the scope of the invention herein it is intended that all matter contained in the above description or showing in the accompanying drawings shall be interpreted in an illustrative and not in a limiting sense.

What is claimed is:

1. An apparatus for improving performance of a parallel write test in a semiconductor memory comprising:

row decoder means for addressing an array of memory cells;

plural column decoder means, each of said column decoder means having an input for receiving a parallel test signal and each of said column decoder means having a pair of address inputs for receiving a pair of address signals; and plural gate means for enabling input of data to and output of data from said array of memory cells, each of said plural gate means corresponding to a different one of said plural column decoder means, each of said gate means comprising at least four gate transistors for connecting bit lines of said array of memory cells to a different set of input/output lines;

wherein each of said column decoder means enables each of said gate transistors in a corresponding one of said gate means during a normal mode of operation in response to each of said address signals; and wherein each of said column decoder means enables all of said gate transistors in all of said gate means in response to said parallel test signal.

2. An apparatus for improving performance of a parallel write test in a semiconductor memory as claimed in claim 1, further comprising:

an array of spare memory cells addressed by said row decoder means, said spare memory cells corresponding in number to a column of said array of memory cells;

plural redundant column decoder means corresponding to said plural column decoder means, each of said redundant column decoder means having an input for receiving said parallel test signal and each of said redundant column decoder means having a pair of address inputs for receiving a pair of address signals; and plural redundant gate means for enabling input of data to and output of data from said array of space memory cells, said plural redundant gate means corresponding to said plural redundant column decoder means, each redundant gate means comprising at least four redundant gate transistors;

wherein if a column in said array of memory cells is deemed to be a defective column the column decoder corresponding to said defective column will be disabled and a corresponding one of said redundant column decoders is enabled to replace data of said defective column with data of a corresponding spare column.

3. An apparatus for improving performance of a parallel write test in a semiconductor memory as claimed in claim 1, further comprising:

a plurality of sense amplifier means, each one of sense amplifier means being connected to a corresponding pair of said gate transistors; and each of said corresponding pair of said gate transistors being connected to a corresponding input/output bit the line pair.

4. An apparatus for performing a parallel write test in a semiconductor memory, comprising:

row decoder means for addressing an array of memory cells;

plural column decoder means, each of said column decoder means having an input for receiving a parallel test signal and each of said column decoder means having plural address inputs for receiving plural address signals;

first gate means for connecting bit lines of said array of memory cells so a corresponding first set of input/output lines, said first gate means being controlled by a first one of said plural column decoder means, said first gate means comprising a plurality of first gate transistors; and second gate means for connecting bit lines of said array of memory cells to a corresponding second set of input/output lines, said second gate means being controlled by a second one of said plural column decoder means said second gate means comprising a plurality of second gate transistors;

wherein each of said column decoder means individually enables only one of said first gate means and said second gate means during a normal mode of operation in response to each of said plural address signals; and wherein each of said column decoder means simultaneously enables both of said first gate means and said second gate means in response to said parallel test signal during a test mode of operation.

5. An apparatus for performing a parallel write test in a semiconductor memory as claimed in claim 4, further comprising:

an array of space memory cells addressed by said row decoder means and corresponding to said array of memory cells;

plural redundant column decoder means corresponding to said plurality of column decoder means, each of said redundant column decoder means having an input for receiving a parallel test signal and each of said redundant column decoder means having plural address inputs for receiving plural address signals; and plural redundant gate means corresponding to said plural redundant column decoder means, each redundant gate means comprising a plurality of redundant gate transistors;

wherein if a column in said array of memory cells is deemed to be defective the column decoder corresponding to that defective column will be disabled and a corresponding one of said redundant column decoders is enabled to replace data of said defective column with data of a corresponding space column of said array of space memory cells.

6. A method for performing a parallel write test in a semiconductor memory device comprising means for sense amplifying, row decoder means for addressing a plurality of memory cells, plural column decoder means, each of said column decoder means having an input for receiving parallel test signal and each of said column decoder means having plural address inputs for receiving a pair of address signals, and plural gate means corresponding to said plural column decoder means, each of said gate means comprising a plurality of gate transistors for connecting bit lines of said memory cells to a different set of input/output lines, said method comprising the steps of:

inputting a pair of address signals to each of said column decoder means;

enabling each of said gate transistors in only one of said gate means during a normal mode of operation to connect said bit lines to one set of said input/output lines in response to each of said column decoder means receiving both of said address signals; and enabling each of said gate transistors in at least two of said gate means to connect said bit lines to at least two sets of said input/output lines in response to each of said column decoder means receiving said parallel test signal during a test mode of operation.

7. A memory device having a multiple bit parallel test capability, said device comprising:

a unit memory cell array providing and receiving data on four complimentary pairs of bit lines, each of said complimentary pairs of bit lines comprising a primary bit line and a complimentary bit line;

row decoding means for accessing rows of said unit memory cell array via word lines;

four complementary pairs of input/output lines, each of said complimentary pairs of input/output lines comprising a primary input/output line and a complementary input/output line;

a first gating transistor group comprising two pairs of first gating transistors connecting a first two of said four complimentary pairs of bit lines to a corresponding first two of said four complimentary pairs of input/output lines;

a second gating transistor group comprising two pairs of second gating transistors connecting a second two of said four complimentary pairs of bit lines to a corresponding second two of said four complimentary pairs of input/output lines;

first column decoding means for controlling said first gating transistor group in response to first address signals and a parallel test enable signal; and second column decoding means for controlling said second gating transistor group in response to second address signals and said parallel test enable signal.

8. A memory device as claimed in claim 7 said first gating transistor group and said second gating transistor group being only alternatingly turned on by said first column decoding means and said second column decoding means, respectively, during a normal data access operation.

9. A memory device as claimed in claim 7, said first going transistor group and said second gating transistor group being simultaneously turned on by said first column decoding means and said second column decoding means, respectively, in response to said parallel test enable signal being indicative of a parallel test operation.

10. A memory device as claimed in claim 9, said first gating transistor group and said second gating transistors group being only alternatingly turned on by said first column decoding means and said second column decoding means, respectively, during a normal data access operation, and said first gating transistor group and said second gating transistor group being simultaneously turned on by said first column decoding means and said second column decoding means, respectively, in response to said parallel test enable signal being indicative of a parallel test operation.

* * * * *

UNITED STATES PATENT AND TRADEMARK OFFICE
CERTIFICATE OF CORRECTION

Page 1 of 2

PATENT NO. : 5,299,161
DATED : 29 March 1994
INVENTOR(S) : Hoon Choi, et al.

It is certified that error appears in the above-indentified patent and that said Letters Patent is hereby corrected as shown below:

Column 1, Line 13   after "test" change "reducing" to --to reduce the--;

Line 19   Before "largely" delete "very";

Line 46   before "coupled" insert --are--;

Column 3, Line 28   after "group" change "40" to --40'--;

Line 60   after "are" change "to the" to --additionally provided--

UNITED STATES PATENT AND TRADEMARK OFFICE
CERTIFICATE OF CORRECTION

PATENT NO. : 5,299,161
DATED : 29 March 1994
INVENTOR(S) : Hoon- Choi, et al.

It is certified that error appears in the above-indentified patent and that said Letters Patent is hereby corrected as shown below:

Column 4

Line 13    after "and" change "byte" to --bits--;

Column 5, Line 52    before "said" insert --,--;

Column 6, Line 25    before "parallel" insert --a--;

Column 7,

Line 15    before "transistor" change "going" to --gating--:

Signed and Sealed this

Nineteenth Day of November, 1996

*Attest:*

BRUCE LEHMAN

*Attesting Officer*    *Commissioner of Patents and Trademarks*